(12) United States Patent
Milkie

(10) Patent No.: US 9,207,271 B2
(45) Date of Patent: Dec. 8, 2015

(54) TEST METHOD FOR SENSE CIRCUIT

(75) Inventor: Kenneth D. Milkie, West Granby, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 341 days.

(21) Appl. No.: 13/530,639

(22) Filed: Jun. 22, 2012

(65) Prior Publication Data
US 2013/0342228 A1   Dec. 26, 2013

(51) Int. Cl.
*G01R 31/00* (2006.01)
*G01R 31/02* (2006.01)

(52) U.S. Cl.
CPC .................. *G01R 31/027* (2013.01)

(58) Field of Classification Search
CPC ....... G01R 31/027; H01H 3/18; H01H 7/1255
USPC ........ 324/546, 547, 726, 750.01; 363/37, 153
See application file for complete search history.

(56) References Cited

U.S. PATENT DOCUMENTS 3,493,839 A * 2/1970 De Puy ............................ 363/53
5,508,620 A   4/1996 Pfiffner

FOREIGN PATENT DOCUMENTS

WO   2007072492 A1   6/2007

OTHER PUBLICATIONS

European Search Report Application No. 13164749.7; dated Sep. 7, 2015; pp. 5.

* cited by examiner

*Primary Examiner* — Vincent Q Nguyen
(74) *Attorney, Agent, or Firm* — Cantor Colburn LLP

(57) ABSTRACT

Embodiments are directed to coupling a first transformer to a first load, coupling a second transformer to a second load, applying a single phase power source to the first transformer, applying an inverted version of the power source to the second transformer, coupling a sensing circuit to the first and second transformers, and monitoring, by the sensing circuit, signal contributions associated with the first and second transformers.

17 Claims, 5 Drawing Sheets

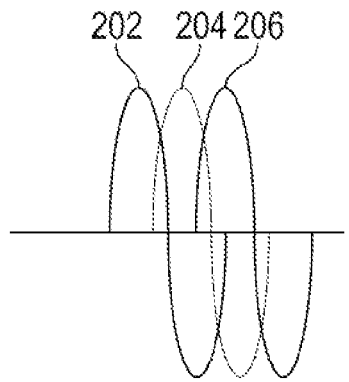
FIG. 2A
FIG. 2B
FIG. 2C
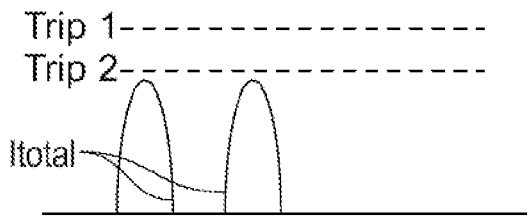
FIG. 3

US 9,207,271 B2

TEST METHOD FOR SENSE CIRCUIT

BACKGROUND

The use of three phase systems or units is prevalent. For example, three phase power may be used in connection with a motor or generator.

A three phase system may include one or more detection units or circuits. For example, a detection unit may be designed to detect whether a fault exists with respect to a unit under test (UUT). If the detection unit is not properly manufactured, assembled, or installed, the detection unit might be unable to detect a fault associated with the UUT. Such a condition may result in the UUT being cleared or accepted for use despite the fault that may be present.

BRIEF SUMMARY

In some embodiments, a method comprises coupling a first transformer to a first load, coupling a second transformer to a second load, applying a single phase power source to the first transformer, applying an inverted version of the power source to the second transformer, coupling a sensing circuit to the first and second transformers, and monitoring, by the sensing circuit, signal contributions associated with the first and second transformers.

In some embodiments, a method comprises applying a single phase power source to a first transformer, coupling the first transformer to a second transformer such that respective phases of the first and second transformer are reversed relative to one another, coupling a load to the second transformer, coupling a sensing circuit to the second transformer, and monitoring, by the sensing circuit, a signal contribution associated with the first and second transformers.

In some embodiments, a system comprises a first transformer, a second transformer, a single phase power source coupled to the first transformer and the second transformer such that an inverted version of the power source is applied to the second transformer relative to an application of the power source to the first transformer, and a sensing circuit configured to monitor a signal contribution associated with the first and second transformers.

Additional embodiments are described below.

BRIEF DESCRIPTION OF THE DRAWINGS

The present disclosure is illustrated by way of example and not limited in the accompanying figures, in which:

FIGS. 2A-2C illustrate exemplary waveforms in accordance with one or more aspects of this disclosure;

FIG. 3 illustrates an exemplary waveform that may be generated in accordance with one or more aspects of this disclosure;

DETAILED DESCRIPTION

Figure 1:
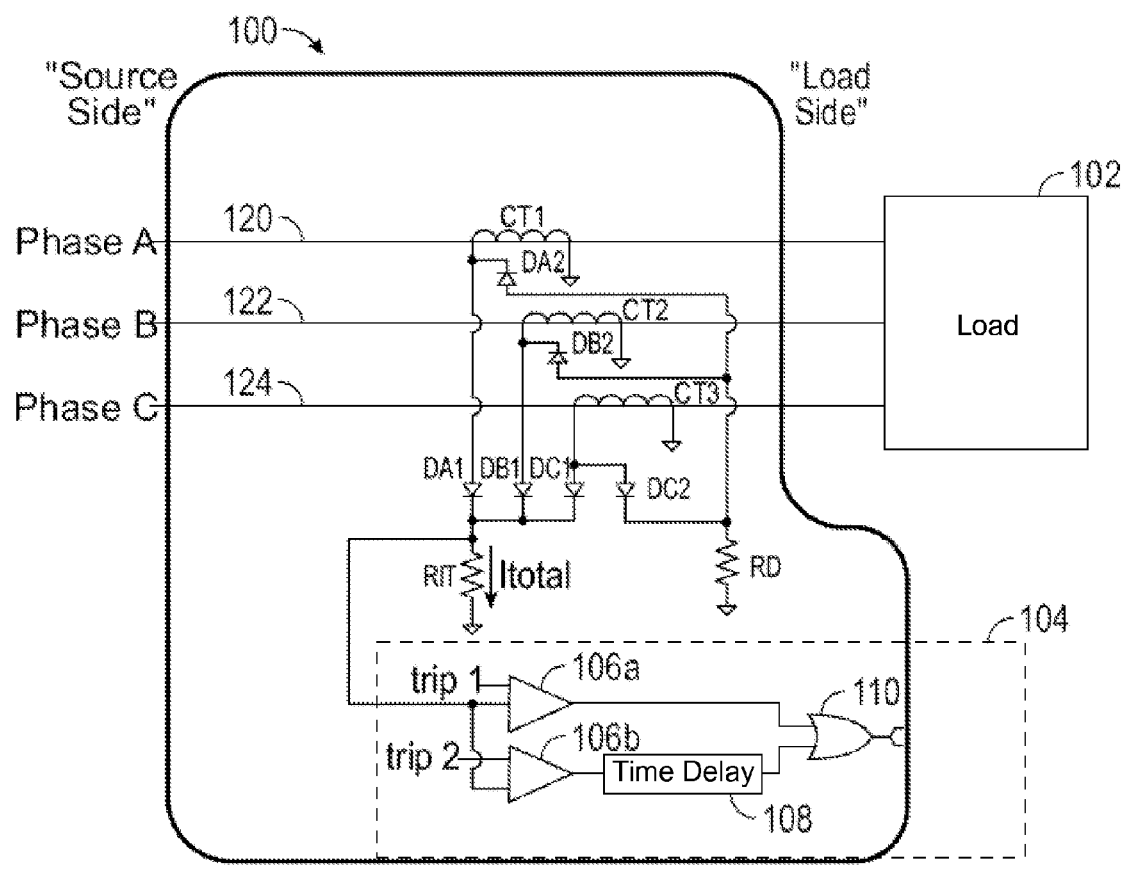
FIG. 1 illustrates an exemplary circuit in accordance with one or more aspects of the disclosure.

In accordance with various aspects of the disclosure, the operation of a detection unit or circuit may be qualified or tested. In some embodiments, a reverse or incorrect phasing of a transformer, such as a current transformer, may be detected. In some embodiments, a test may be provided that uses a single phase power source to detect an improper phasing of a sensing circuit, such as a three phase current sensing circuit.

It is noted that various connections are set forth between elements in the following description and in the drawings (the contents of which are included in this disclosure by way of reference). It is further noted that these connections in general and, unless specified otherwise, may be direct or indirect and that this specification is not intended to be limiting in this respect. In this regard, a coupling of entities, components, and/or devices may refer to either a direct connection or an indirect connection.

FIG. 1 illustrates an exemplary circuit 100 that may (typically) be used to sense one or more signals (e.g., currents) associated with a unit under test, such as a three phase system or unit. The three phase system/unit may be representative of a load, such as a load 102. In some embodiments, the load 102 may correspond to a motor. In some embodiments, the load 102 may be arranged in accordance with a wye or delta configuration.

The circuit 100 may include one or more current transformers (CTs). The CTs may be used to produce a current proportional to the currents that may be present in the load 102. The CTs may be used when the currents in the load 102 are large, relative to the capabilities or parameters of a monitoring circuit 104 described below.

Three CTs, labeled CT1, CT2, and CT3, are shown in the circuit 100. CT1 may be associated with a first phase (labeled phase A) of the three phase system, CT2 may be associated with a second phase (labeled phase B) of the three phase system, and CT3 may be associated with a third phase (labeled phase C) of the three phase system.

As used herein, with respect to the current transformers CT1-CT3, the left-hand side of the circuit 100 may generally be referred to as the "source side" of the circuit 100. Similarly, the right-hand side of the circuit 100 may generally be referred to as the "load side" of the circuit 100.

The circuit 100 may include a set of diodes DA1, DA2, DB1, DB2, DC1, and DC2. The set of diodes (in combination with a resistor RD) as arranged in FIG. 1 may serve as a rectifier by eliminating portions of the signals (e.g., currents) associated with CT1, CT2, and CT3 below the turn-on thresholds associated with the diodes. As configured, the diodes may also serve to sum the currents associated with CT1, CT2, and CT3, which may result in a total current (labeled Itotal in FIG. 1) flowing through a resistor RIT. As illustrated, each of individual diode set Dx1 and Dx2 (e.g., where 'x' may be substituted with A, B, or C to correspond Dx1 and Dx2 to DA1, DA2, DB1, DB2, DC1, and DC2) respectively coupled between RIT and the CTy and the CTy and RD (e.g., where 'y' may be substituted with 1, 2, or 3 do correspond CTy to CT1, CT2, and CT3).

The current Itotal flowing through the resistor RIT may produce a voltage across the resistor RIT. That voltage may, in turn, be monitored by the monitoring circuit 104.

The monitoring circuit 104 may include one or more comparators, such as first and second comparators 106a and 106b. The first comparator 106a may be associated with a first threshold, which may be established by the voltage present at the node labeled trip1 in FIG. 1. Similarly, the second comparator 106b may be associated with a second threshold, which may be established by the voltage present at the node labeled trip2 in FIG. 1. Thus, the voltages associated with trip1 and trip2 may serve as reference voltages for the first and second comparators 106a and 106b, respectively. The voltage associated with trip1 may be the same as, or different from, the voltage associated with trip2.

In some embodiments, the monitoring circuit 104 may include a time delay 108. The time delay 108 may be used to delay a reporting of a 'trip' condition detected by one of the comparators, such as the second comparator 106b.

As shown in FIG. 1, the output of the first comparator 106a and the output of the second comparator 106b (as potentially subjected to the time delay 108) may be combined. The combination may be realized using one or more gates, such as an 'OR' gate 110. Thus, if one or both of the comparator 106a and the comparator 106b detects a 'trip' condition, the gate 110 may output a '1' or 'true' value, thereby serving as a warning or indication of an excessive value for the current Itotal flowing through resistor RIT.

The voltages associated with trip1 and trip2, and the delay time associated with the time delay 108, may be selected based on a particular application or environment and may be based on the value of the resistor RIT. For example, in the context of a three phase motor application in an aircraft environment, the voltage associated with trip2 and the delay associated with the time delay 108 may be selected to guard against "nuisance faults," such as a gust of wind causing a temporary, low-level spike or increase in current. If the spike or increase in current persists for long enough (e.g., beyond the time associated with the time delay 108), then the output of the time delay 108 may be driven to a '1' or 'true' state, causing the output of the gate 110 to also be driven to a '1' or 'true' state. In that same application, the voltage associated with trip1 may be set at a value higher than the trip2 voltage, such that the comparator 106a may be used to detect for, e.g., a short circuit in the motor. Other use case scenarios may be considered in connection with the monitoring circuit 104, and the values for or the configuration of the monitoring circuit 104 may be adjusted accordingly.

Three waveforms are depicted in FIGS. 2A-2C. The waveforms in FIGS. 2A-2C may be indicative of the operation of the circuit 100 when the circuit 100 is properly manufactured/assembled, such as when each phase of the current transformers CT1-CT3 is properly oriented.

Three currents, labeled 202, 204, and 206, are shown in FIG. 2A and represent currents that may exist in connection lines 120, 122 and 124 of FIG. 1. The current 202 may be associated with a first phase (e.g., phase A) of the three phase system/unit, the current 204 may be associated with a second phase (e.g., phase B) of the three phase system/unit, and current 206 may be associated with a third phase (e.g., phase C) of the three phase system/unit.

The currents 202, 204, and 206 may be shifted by a third of a cycle, or one-hundred twenty (120) degrees, relative to one another. While shown as sinusoidal in form, the currents 202, 204, and 206 may take on other forms or shapes in some embodiments.

The currents 202, 204, and 206, when applied to their respective phases of the circuit 100, may cause the generation of Itotal in FIG. 1. FIG. 2B illustrates an example of Itotal corresponding to the summation of the currents 202, 204, and 206 under so-called 'normal' conditions wherein the value of Itotal does not exceed either of the thresholds established by trip1 and trip2.

The Itotal waveform in FIG. 2B may be the result of a 'normal' condition with respect to the load 102. Conversely, FIG. 2C illustrates a condition in which the Itotal value may exceed the trip2 threshold; such condition may be the result of a load (e.g., resistance) change on one or more of the phases.

In reference to FIG. 2C, the load change that may have caused the Itotal parameter to exceed the trip2 threshold might not be detected if, for example, one of the current transformers CT1-CT3 is assembled with its phase disoriented or reversed. Such a condition may be a result of merely detecting the peaks or amplitudes associated with the Itotal current.

FIG. 3 illustrates a waveform that may be used to describe how merely detecting the peaks or amplitudes associated with the Itotal current may cause a fault to be missed or overlooked if one of the current transformers CT1-CT3 is assembled with its phase disoriented or reversed. The waveform depicted in FIG. 3 may have been generated as a result of applying a single phase input power to one input phase (e.g., phase A). If that same single phase input power was then successively applied to the second input phase (e.g., phase B), and then the third input phase (e.g., phase C) in turn, a waveform similar to the one shown in FIG. 3 might be produced at each step. If one of the current transformers CT1-CT3 is assembled with its phase disoriented or reversed, the waveform of FIG. 3 would merely undergo an inversion, or a one-hundred eighty (180) degree phase shift. The inversion or phase shift might simply result in a time translation, and might not impact the magnitude or amplitude of the signal (e.g., Itotal) being monitored.

Figure 4B:
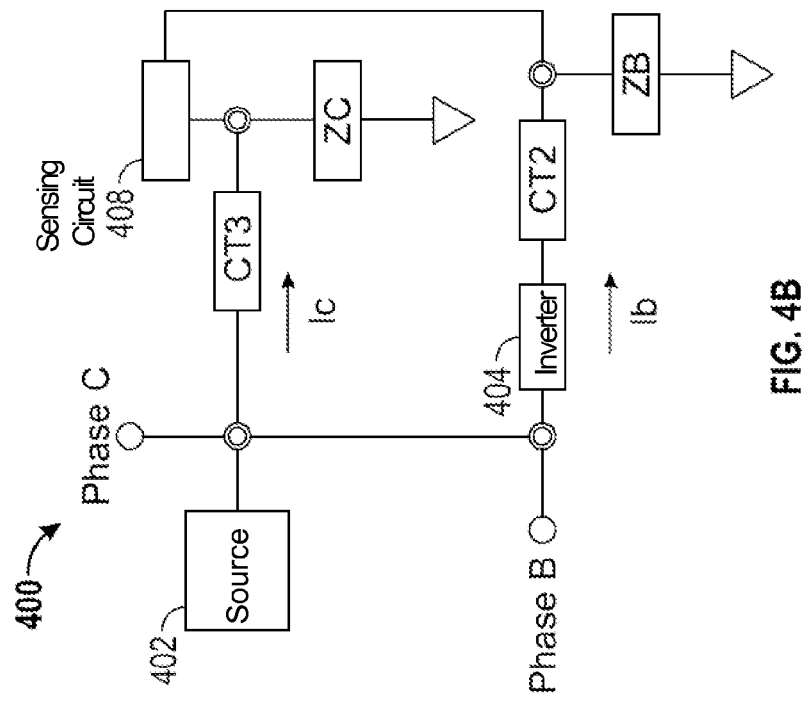
FIGS. 4A-4B illustrate exemplary circuits in accordance with one or more aspects of this disclosure.
Figure 4A:
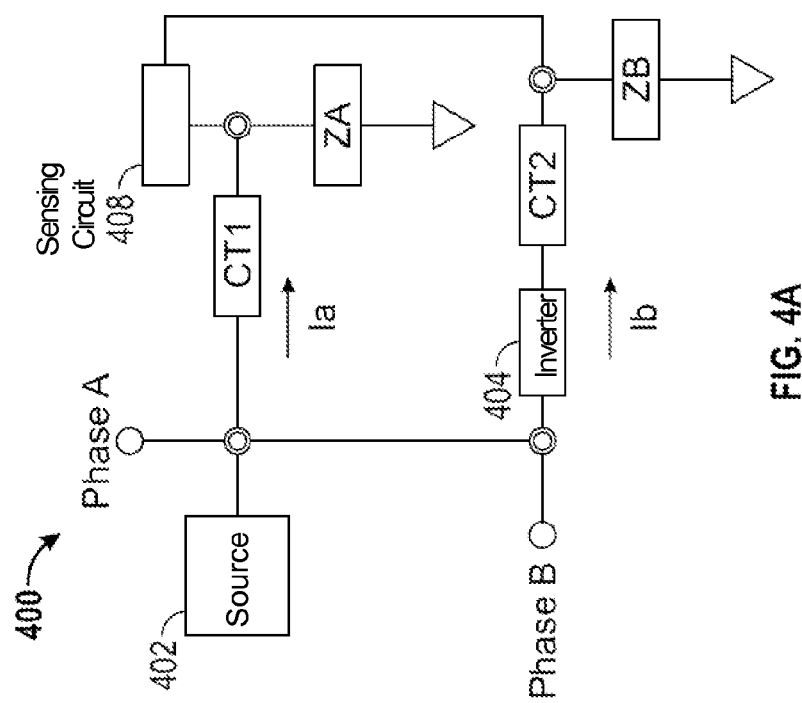

FIGS. 4A-4B (collectively referred to as FIG. 4) illustrate a circuit 400. The circuit 400 may include components or devices similar to, or corresponding to, those described above with respect to the circuit 100 of FIG. 1. Portions of the circuit 100 have been omitted from the circuit 400 for ease of explanation and illustrative simplicity. As described further below, the circuit 400 may be used to detect if a CT (e.g., one of CT1-CT3) is assembled with its phase disoriented or reversed.

FIG. 4A illustrates a first portion of the circuit 400. As shown in FIG. 4A, a source 402, such as a single phase input power source, may be provided to a first phase (e.g., phase A) and a second phase (e.g., phase B). A current 'Ia' may flow through a first CT (e.g., CT1) of the first phase and through a first load (labeled ZA in FIG. 4A) coupled to ground. The load ZA may be a resistor in some embodiments. A current 'Ib' may flow through a second CT (e.g., CT2) of the second phase and through a second load (labeled ZB in FIG. 4A) coupled to ground. The load ZB may be a resistor in some embodiments. In some embodiments, the loads ZA and ZB may be the same value.

An inverter may be included in one of the paths from the source 402 to ground. For example, as shown in FIG. 4A, an inverter 404 may be coupled to the source 402 and the current transformer CT2 in connection with the second phase (phase B). The inverter 404 may contribute a one hundred eighty (180) degree phase shift in terms of the input-output relationship of the inverter 404. If the current transformers CT1 and CT2 are assembled with their phases oriented properly or correctly (e.g., oriented in the same direction or manner), a summation of the currents in the first and second phases by a sensing circuit 408 (which may include one or more components or devices described above in connection with FIG. 1) coupled to CT1, ZA, CT2, and ZB might not cause a trip condition (e.g., a trip of the monitoring circuit 104 of FIG. 1). For example, the currents may add destructively. Conversely, if one of the current transformers (e.g., CT2) is assembled with its phase disoriented or reversed relative to the other of the current transformers (e.g., CT1), the currents may add constructively, such that the summation of the currents in the first and second phases by the sensing circuit 408 may cause a trip condition. Such a constructive addition may be a result of the cancelation of the phase shift of the inverter 404 by the reversal associated with the "disoriented" current transformer (e.g., CT2).

FIG. 4B illustrates a second portion of the circuit 400. The second portion of the circuit 400 shown in FIG. 4B may be analogous to the first portion of the circuit 400 shown in FIG. 4A. Relative to the FIG. 4A, FIG. 4B may remove the application of the source 402 from the first phase (e.g., phase A) and apply the source 402 to the third phase (e.g., phase C) and its associated components (e.g., CT3 and a load ZC), such that a current Ic may flow through such components. The load ZC may be a resistor in some embodiments. In some embodiments, the loads ZB and ZC may be the same value. In some embodiments, the load ZC may correspond to the load ZA (e.g., the load ZA may be decoupled from CT1 and coupled to CT3). As shown in FIG. 4B, the sensing circuit 408 may be coupled to CT3 and ZC.

In FIG. 4B, if the current transformers CT2 and CT3 are assembled with their phases oriented properly or correctly (e.g., oriented in the same direction or manner), the summation of the currents in the second and third phases might not cause a trip condition. For example, the currents may add destructively. Conversely, if one of the current transformers (e.g., CT2) is assembled with its phase disoriented or reversed relative to the other of the current transformers (e.g., CT3), the currents may add (constructively), such that the summation of the currents in the second and third phases by the sensing circuit 408 may cause a trip condition.

After having applied the source 402 to the portions of the circuit 400 shown in FIG. 4, one may identify which one of the current transformers CT1-CT3 is assembled with its phase disoriented or reversed (e.g., CT2) relative to the other current transformers (e.g., CT1 and CT3), if such a reversal exists.

Figure 5B:
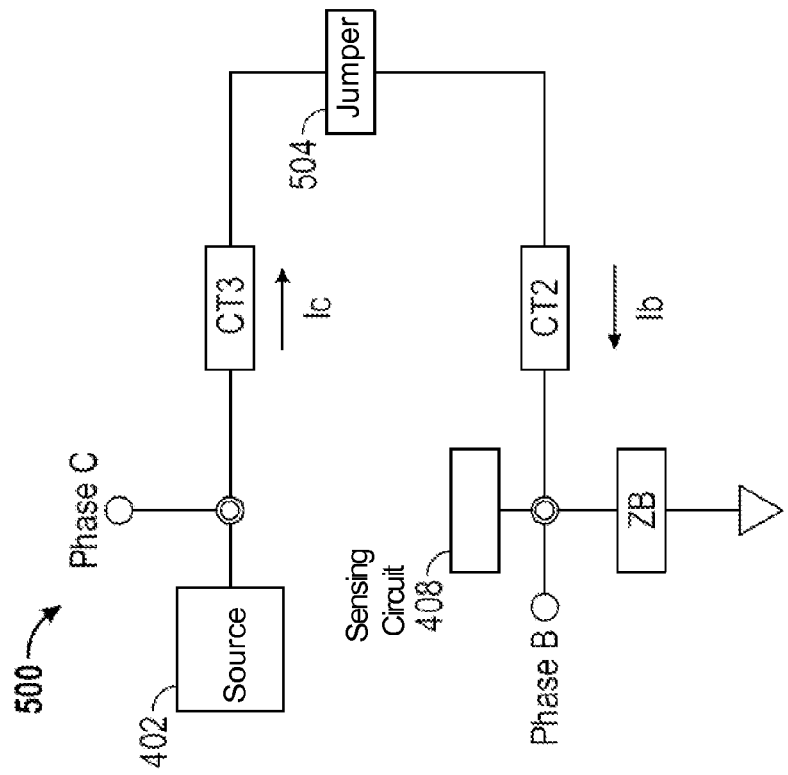
FIGS. 5A-5B illustrate exemplary circuits in accordance with one or more aspects of this disclosure.
Figure 5A:
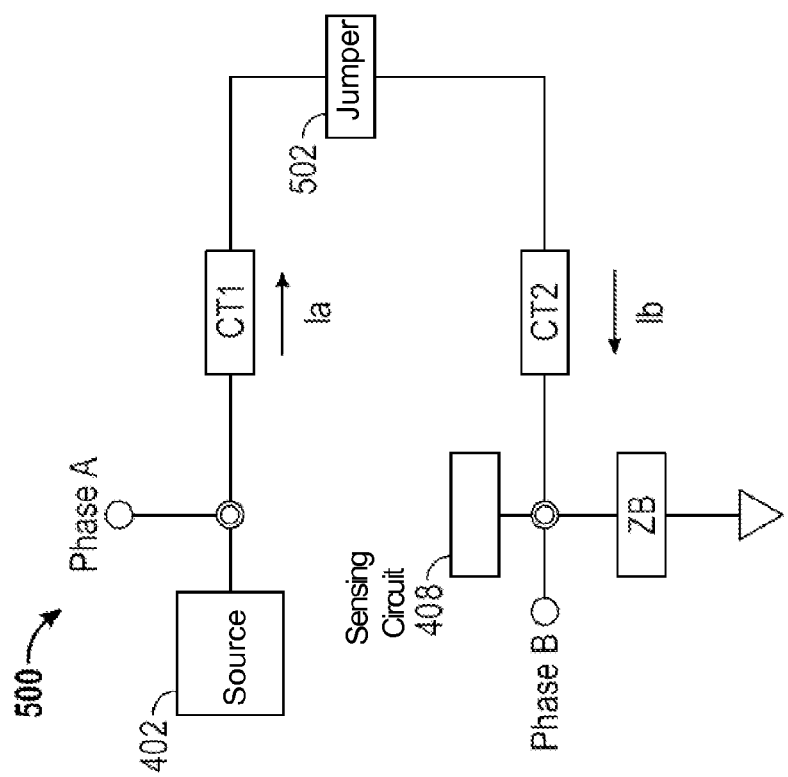

FIGS. 5A-5B (collectively referred to as FIG. 5) illustrate a circuit 500. The circuit 500 may represent an alternative embodiment to the circuit 400 of FIG. 4.

FIG. 5A illustrates a first portion of the circuit 500. As shown in FIG. 5A (which may be the counterpart of FIG. 4A), the source 402 may continue to be applied at the "source side" of the first phase (phase A). However, at the "load side," the loads ZA and ZB may be removed and a jumper 502 may be installed. The jumper 502 may be coupled to CT1 and CT2 in the manner shown in FIG. 5A. At the "source side," the load ZB may be coupled to the second phase (phase B) between CT2 and ground as shown in FIG. 5A.

Comparing FIG. 5A to FIG. 4A: (1) the inverter 404 is not present, and (2) the current 'Ib' is oriented to flow through CT2 in an opposite direction. In other words, the inversion or phase shift that was obtained by use of the inverter 404 in FIG. 4A may be achieved simply by changing the direction of flow of the current 'Ib' through or across CT2 in FIG. 5A relative to FIG. 4A.

FIG. 5B illustrates a second portion of the circuit 500. The second portion of the circuit 500 shown in FIG. 5B may be analogous to the first portion of the circuit 500 shown in FIG. 5A. As shown in FIG. 5B (which may be the counterpart of FIG. 4B), the source 402 may be applied at the "source side" of the third phase (phase C), and CT3 may be coupled to CT2 by way of a jumper 504 at the "load side." The jumper 504 may correspond to the jumper 502 (e.g., the jumper 502 may be decoupled from CT1 and coupled to CT3 in transitioning from FIG. 5A to FIG. 5B).

Comparing FIG. 5B to FIG. 4B: (1) the inverter 404 is not present, and (2) the current 'Ib' is oriented to flow through CT2 in an opposite direction. In other words, the inversion or phase shift that was obtained by use of the inverter 404 in FIG. 4B may be achieved simply by changing the direction of flow of the current 'Ib' through or across CT2 in FIG. 5B relative to FIG. 4B.

The various circuits described herein are illustrative. In some embodiments, one or more of the components or devices may be optional. In some embodiments, one or more additional components or devices may be included. In some embodiments, the components or devices may be arranged different from what is shown in the FIGS.

Figure 6:
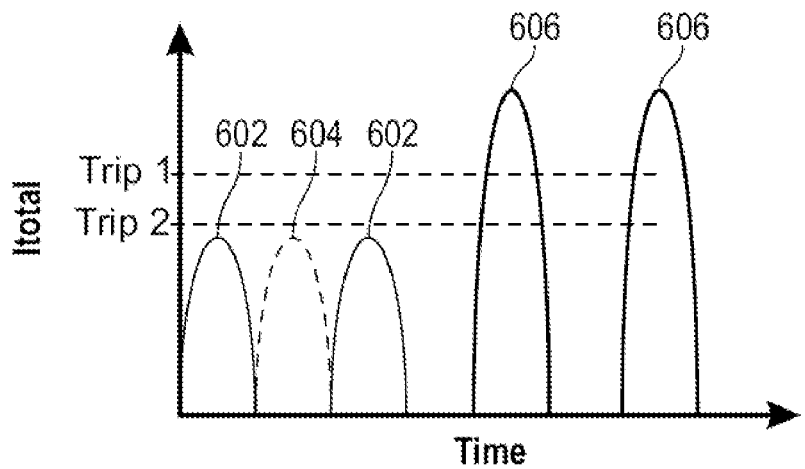
FIG. 6 illustrates an exemplary waveform that may be generated in accordance with one or more aspects of this disclosure.

FIG. 6 illustrates a waveform that may be generated by one or more of the circuits described herein. For example, the waveform shown in FIG. 6 may be generated by coupling or applying a power source to two phases (e.g., phase A and phase B).

As shown in FIG. 6, under normal conditions (e.g., where the current transformers CT1 and CT2 are oriented properly) a total current (Itotal) might not exceed the trip thresholds trip1 and trip2. The solid lines 602 may be indicative of the current contribution of the first phase (phase A), and the dashed line 604 may be indicative of the current contribution of the second phase (phase B). The (dis)placement of the dashed line 604 relative to the solid lines 602 may be the result of an inversion or one hundred eighty (180) degree phase shift between the first phase and the second phase. Conversely, where one of the current transformers (e.g., CT2) has its phase disoriented or reversed relative to the other current transformer (e.g., CT1), the current contributions from the first and second phase may add constructively, resulting in the solid lines 606 exceeding one or both of the trip thresholds trip1 and trip2.

Figure 7:
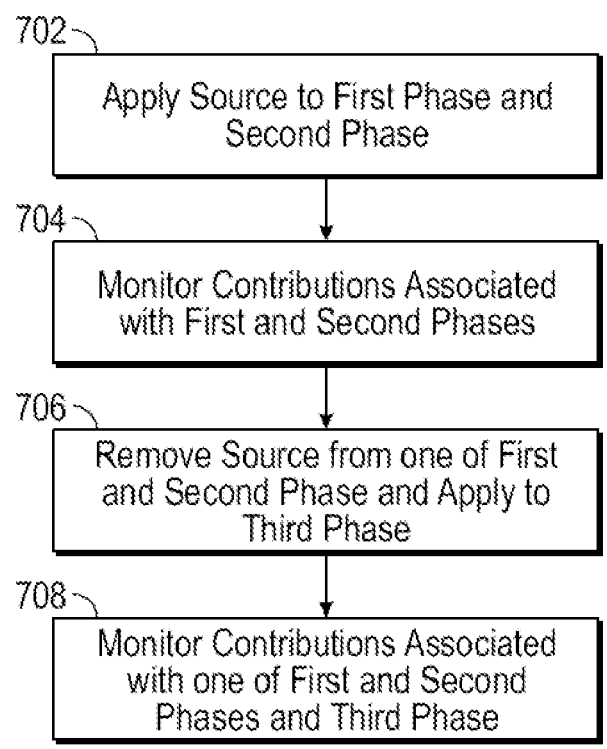
FIG. 7 illustrates a method in accordance with one or more aspects of this disclosure.

FIG. 7 illustrates a method 700. The method 700 may be operative in conjunction with one or more circuits, such as the circuits described herein. The method 700 may be used to determine if a first current transformer is assembled with its phase disoriented or reversed relative to at least two additional current transformers.

In step 702, a source, such as a single phase input power source may be applied to a first phase (e.g., phase A) and a second phase (e.g., phase B). The source may be applied directly to each of the first and second phases (e.g., FIG. 4A) or directly to the first phase and indirectly to the second phase (e.g., FIG. 5A).

In step 704, current contributions of each of the two phases associated with step 702 may be monitored relative to one or more thresholds or trip points. If the phases of the current transformers of each of the two phases are oriented properly (with respect to one another), then the current contributions might not exceed the threshold(s). Conversely, if a threshold is detected as having been exceeded, then a phase of a current transformer may be disoriented or reversed.

In step 706, the source may be removed from one of the first and second phases (e.g., phase A) and applied to the other of the first and second phases (e.g., phase B) and a third phase (e.g., phase C). As part of step 706, the source may be applied directly to each of the other of the first and second phases and the third phase (e.g., FIG. 4B) or directly to the third phase and indirectly to the other of the first and second phases (e.g., FIG. 5B).

In step 708, current contributions of each of the two phases associated with step 706 to which the source is applied may be monitored relative to one or more thresholds or trip points. If the phases of the current transformers of each of the two phases are oriented properly (with respect to one another), then the current contributions might not exceed the threshold(s). Conversely, if a threshold is exceeded, then a phase of a current transformer may be disoriented or reversed.

If a first current transformer is assembled with its phase disoriented or reversed relative to at least two other current transformers, execution of the method 700 may serve to identify that first current transformer.

The steps shown in FIG. 7 are illustrative. In some embodiments, some of the steps (or portions thereof) may be optional. In some embodiments, additional steps not shown may be included. In some embodiments, the steps may execute in an order or sequence different from what is shown.

While described above in the context of monitoring current contributions of each phase of a three phase system, it is understood that another parameter could be monitored. For example, one or more of voltage, energy, power, etc., may be monitored in addition to, or as an alternative to, monitoring current.

In some embodiments various functions or acts may take place at a given location and/or in connection with the operation of one or more apparatuses or systems. In some embodiments, a portion of a given function or act may be performed at a first device or location, and the remainder of the function or act may be performed at one or more additional devices or locations. Embodiments of the disclosure may be directed to one or more systems, apparatuses, and/or methods.

Embodiments of the disclosure may be implemented using hardware, software, firmware, or any combination thereof. In some embodiments, various mechanical components known to those of skill in the art may be utilized.

Embodiments of the disclosure may be tied to particular machines. For example, in some embodiments one or more circuits may be used to monitor or sense the operation of a three phase system. In the circuit(s), a first phase may be inverted relative to a second phase, and an output signal may be monitored to detect whether a component or device (e.g., a current transformer) has been properly manufactured or assembled.

Embodiments of the disclosure may transform an article into a different state or thing. For example, a signal associated with a first phase of a three phase system may be inverted with respect to the application of that signal to a second phase of the three phase system. The inversion may be used to detect whether a component or device (e.g., a current transformer) has been properly manufactured or assembled.

Aspects of the disclosure have been described in terms of illustrative embodiments thereof Numerous other embodiments, modifications and variations within the scope and spirit of the appended claims will occur to persons of ordinary skill in the art from a review of this disclosure. For example, one of ordinary skill in the art will appreciate that the steps described in conjunction with the illustrative figures may be performed in other than the recited order, and that one or more steps illustrated may be optional in accordance with aspects of the disclosure.

What is claimed is:

1. A method comprising:
   coupling a first transformer to a first load;
   coupling a second transformer to a second load;
   applying a single phase power source to the first transformer;
   applying an inverted version of the power source to the second transformer;
   coupling a sensing circuit to the first and second transformers; and
   monitoring, by the sensing circuit, signal contributions associated with the first and second transformers.

2. The method of claim 1, further comprising:
   decoupling the sensing circuit from the first transformer;
   coupling a third transformer to a third load;
   coupling the sensing circuit to the third transformer;
   removing the power source from the first transformer;
   applying the power source to the third transformer; and
   monitoring, by the sensing circuit, signal contributions associated with the second and third transformers.

3. The method of claim 2, further comprising:
   detecting that at least one of the monitored signal contributions associated with the first and second transformers and the monitored signal contributions associated with the second and third transformers exceeds a threshold; and
   responsive to said detecting, identifying one of the first, second, and third transformers as having a reversed phase.

4. The method of claim 2, wherein the third load is the same load as the first load, the method comprising:
   decoupling the first load from the first transformer.

5. The method of claim 1, wherein the first and second transformers are current transformers, and wherein the monitored signal contributions comprise monitored currents associated with the first and second current transformers.

6. A method comprising:
   applying a single phase power source to a first transformer;
   coupling the first transformer to a second transformer such that respective phases of the first and second transformer are reversed relative to one another;
   coupling a load to the second transformer;
   coupling a sensing circuit to the second transformer; and
   monitoring, by the sensing circuit, a signal contribution associated with the first and second transformers.

7. The method of claim 6, further comprising:
   coupling the first and second transformers via a jumper.

8. The method of claim 6, further comprising:
   removing the power source from the first transformer;
   decoupling the first transformer from the second transformer;
   coupling a third transformer to the second transformer such that respective phases of the second and third transformer are reversed relative to one another;
   applying the power source to the third transformer; and
   monitoring, by the sensing circuit, a signal contribution associated with the second and third transformers.

9. The method of claim 8, further comprising:
   detecting that at least one of the monitored signal contribution associated with the first and second transformers and the monitored signal contribution associated with the second and third transformers exceeds a threshold; and
   responsive to said detecting, identifying one of the first, second, and third transformers as having a reversed phase.

10. The method of claim 6, wherein the first and second transformers are current transformers, and wherein the monitored signal contribution comprises a monitored current associated with the first and second current transformers.

11. A system comprising:
    a first transformer;
    a second transformer;
    a single phase power source coupled to the first transformer and the second transformer such that an inverted version of the power source is applied to the second transformer relative to an application of the power source to the first transformer; and
    a sensing circuit configured to monitor a signal contribution associated with the first and second transformers.

12. The system of claim 11, further comprising:
an inverter coupled between the power source and the second transformer.

13. The system of claim 11, further comprising:
a jumper coupled to the first and second transformers and configured to connect the first and second transformers in series to obtain the inverted version of the power source as applied to the second transformer.

14. The system of claim 11, further comprising:
a third transformer coupled to the power source when the first transformer is decoupled from the power source such that an inverted version of the power source is applied to the second transformer relative to an application of the power source to the third transformer; and
the sensing circuit is configured to monitor a signal contribution associated with the second and third transformers.

15. The system of claim 14, wherein the sensing circuit is configured to detect that at least one of the monitored signal contribution associated with the first and second transformers and the monitored signal contribution associated with the second and third transformers exceeds a threshold, and wherein the sensing circuit, responsive to said detecting, is configured to identify one of the first, second, and third transformers as having a reversed phase.

16. The system of claim 11, wherein the sensing circuit is configured to compare the monitored signal contribution to a threshold associated with a short circuit condition of a motor associated with a three phase system.

17. The system of claim 16, wherein the sensing circuit is configured to compare the monitored signal contribution to a second threshold that is subjected to a time delay.

* * * * *